(12) United States Patent
Edelstein et al.

(10) Patent No.: US 7,968,949 B2
(45) Date of Patent: Jun. 28, 2011

(54) CONTACT FORMING METHOD AND RELATED SEMICONDUCTOR DEVICE

(75) Inventors: Daniel C. Edelstein, White Plains, NY (US); Louis Lu-Chen Hsu, Fishkill, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 11/668,717

(22) Filed: Jan. 30, 2007

(65) Prior Publication Data
US 2008/0179660 A1 Jul. 31, 2008

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................................. 257/382; 257/383
(58) Field of Classification Search .............. 257/382, 257/383, 640, 649, 900
See application file for complete search history.

(56) References Cited

U.S. PATENT DOCUMENTS

| 6,960,523 | B2* | 11/2005 | Maldei et al. | 438/639 |
|---|---|---|---|---|
| 7,071,517 | B2* | 7/2006 | Kim et al. | 257/382 |
| 2002/0132403 | A1* | 9/2002 | Hung et al. | 438/186 |
| 2004/0043574 | A1 | 3/2004 | Steiner et al. | |
| 2004/0092090 | A1 | 5/2004 | Han et al. | |
| 2005/0208725 | A1 | 9/2005 | Kim et al. | |
| 2006/0009041 | A1* | 1/2006 | Iyer et al. | 438/724 |
| 2006/0094216 | A1 | 5/2006 | Nam | |
| 2007/0138564 | A1* | 6/2007 | Lim et al. | 257/369 |

* cited by examiner

*Primary Examiner* — Thien F Tran
(74) *Attorney, Agent, or Firm* — Katherine S. Brown; Hoffman Warnick LLC

(57) ABSTRACT

Contact forming methods and a related semiconductor device are disclosed. One method includes forming a first liner over the structure and the substrate, the first liner covering sidewall of the structure; forming a dielectric layer over the first liner and the structure; forming a contact hole in the dielectric layer to the first liner; forming a second liner in the contact hole including over the first liner covering the sidewall; removing the first and second liners at a bottom of the contact hole; and filling the contact hole with a conductive material to form the contact. The thicker liner(s) over the sidewall of the structure prevents shorting, and allows for at least maintaining any intrinsic stress in one or more of the liner(s).

5 Claims, 4 Drawing Sheets

US 7,968,949 B2

CONTACT FORMING METHOD AND RELATED SEMICONDUCTOR DEVICE

BACKGROUND

1. Technical Field

The disclosure relates generally to integrated circuit (IC) fabrication, and more particularly, to methods of forming a contact, and a related semiconductor device.

2. Background Art

As semiconductor devices have continually scaled to smaller sizes, e.g., below a 90 nm regime, major challenges arise relative to forming contacts to the devices. For example, shorting between a device's source/drain and the gate conductor due to the small space between gates is a problem. In addition, patterning smaller contacts presents a problem. More particularly, contact size and the alignment tolerance of a contact to a device cannot be scaled (miniaturized) at the same pace as the semiconductor device itself. FIG. 1 illustrates some of the problems. FIG. 1 shows a gate 10 and a contact hole 12 opened adjacent thereto, and a dielectric stress liner 14 (dark black line) for device performance enhancement. A sidewall 16 of gate 10 can be severely damaged when removing liner 14 from a bottom of contact hole 12. In particular, an upper corner 18 of gate 10 is very vulnerable during etching such that any over-etch to clean liner 14 may expose gate 10. Normally, however, in order to ensure proper formation of a small contact opening, certain over-etching is necessary. However, it is crucial to avoid damaging sidewall 16 of gate 10 during the etching.

One approach to address this situation is disclosed in US Patent Publication US2004/0092090A1 to Jae-Jung Han et al., which describes a method of forming a gate electrode. In this approach, after a gate structure is formed on a substrate, a first oxide film is formed on a sidewall of the gate structure and on the substrate by re-oxidizing the gate structure and the substrate under an atmosphere including an oxygen gas and an inert gas. The gate structure has a gate oxide film pattern, a polysilicon film pattern and a metal silicide film pattern. A portion of the first oxide film formed on a sidewall of the polysilicon film pattern has a thickness substantially identical to that of a portion of the first oxide film formed on a sidewall of the metal silicide film pattern. One issue with this approach is that when the devices are formed there is not much of a thermal budget left to allow thermal oxidation. Very shallow junctions are especially difficult to handle using this approach because the oxidation, even if done at very low temperature, could be detrimental to the junctions. In addition, since all the layers in this approach are formed before contact formation, i.e., none of the layers are formed after the contact hole is opened, there is no guarantee that this is a short-proof solution.

Another challenge is maintaining any intrinsic stress of liner 14 as it is pierced by the contacts. More particularly, the application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents). One way to apply such stresses to a FET is the use of intrinsically-stressed liners, e.g., of silicon nitride ($Si_3N_4$). For example, a tensile-stressed silicon nitride liner may be used to cause tension in an NFET channel while a compressively-stressed silicon nitride liner may be used to cause compression in a PFET channel. Unfortunately, when the liner is punched with millions of holes for the contacts, the stress characteristic is greatly degraded. As a result, the effect of carrier mobility enhancement is also diminished and the device performance enhancement feature is lost.

SUMMARY

Contact forming methods and a related semiconductor device are disclosed. One method includes forming a first liner over the structure and the substrate, the first liner covering sidewall of the structure; forming a dielectric layer over the first liner and the structure; forming a contact hole in the dielectric layer to the first liner; forming a second liner in the contact hole including over the first liner covering the sidewall; removing the first and second liners at a bottom of the contact hole; and filling the contact hole with a conductive material to form the contact. The thicker liner(s) over the sidewall of the structure prevents shorting, and allows for at least maintaining any intrinsic stress in one or more of the liner(s).

A first aspect of the disclosure provides a method of forming a contact adjacent to a structure on a substrate, the method comprising: forming a first liner over the structure and the substrate, the first liner covering sidewall of the structure; forming a dielectric layer over the first liner and the structure; forming a contact hole in the dielectric layer to the first liner; forming a second liner in the contact hole including over the first liner covering the sidewall; removing the first and second liners at a bottom of the contact hole; and filling the contact hole with a conductive material to form the contact.

A second aspect of the disclosure provides a semiconductor device comprising: a gate structure including a dielectric cap; a contact adjacent to the gate structure, the contact extending over a corner of the gate structure; a first liner extending along a sidewall of the gate structure; and a second liner over the first liner over the sidewall of the gate structure.

A third aspect of the disclosure provides a method comprising: forming a gate structure on a substrate, the gate including a dielectric cap; forming a liner over the gate structure and the substrate, due to existing topology the liner having a thickness along a sidewall of the gate structure that is substantially thicker than a thickness of the liner over the substrate; and forming a contact extending over the corner of the gate structure, the liner and the dielectric cap preventing opening of the corner during the contact forming.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 5:
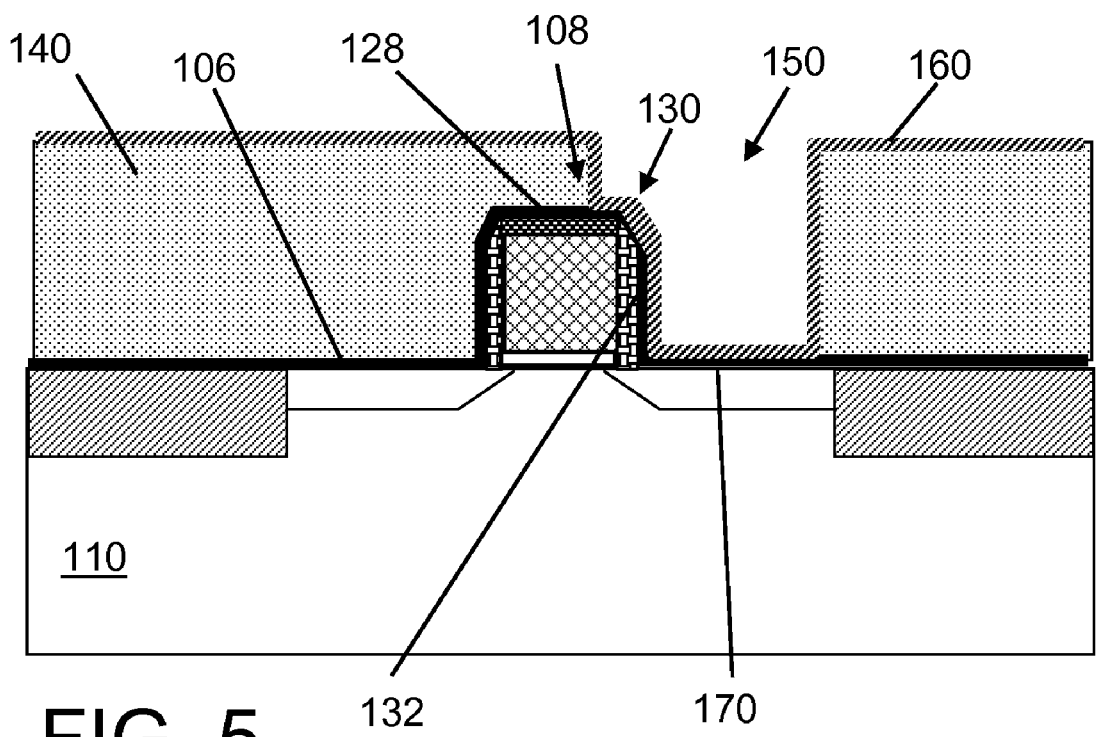
Figure 6:
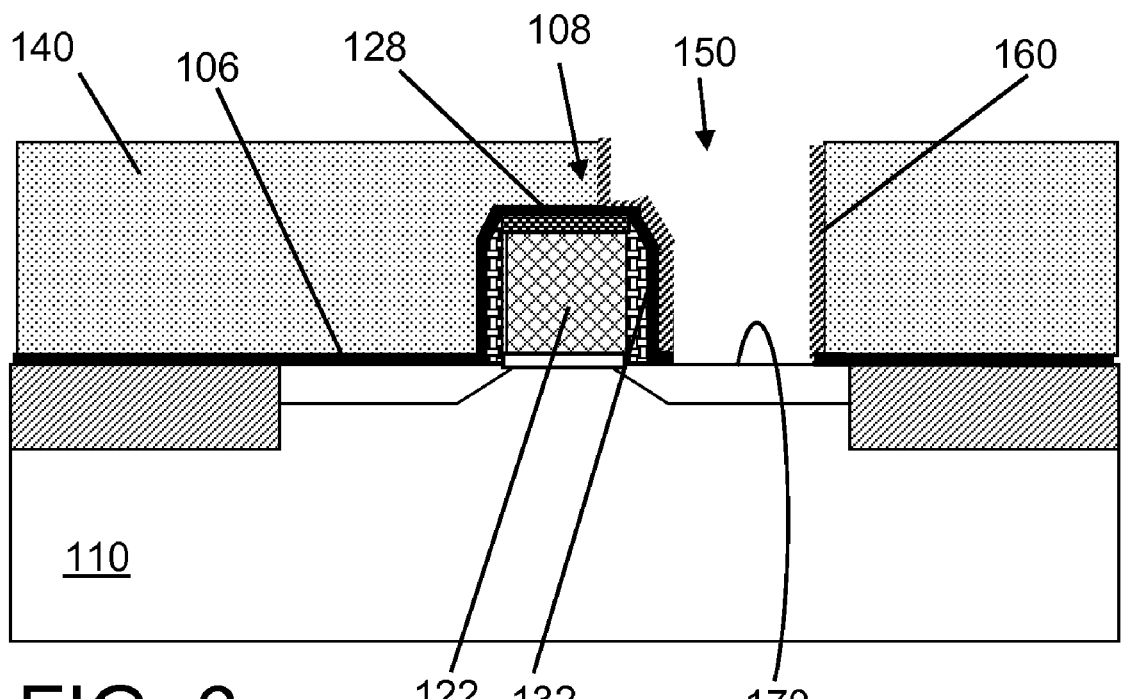
Figure 7:
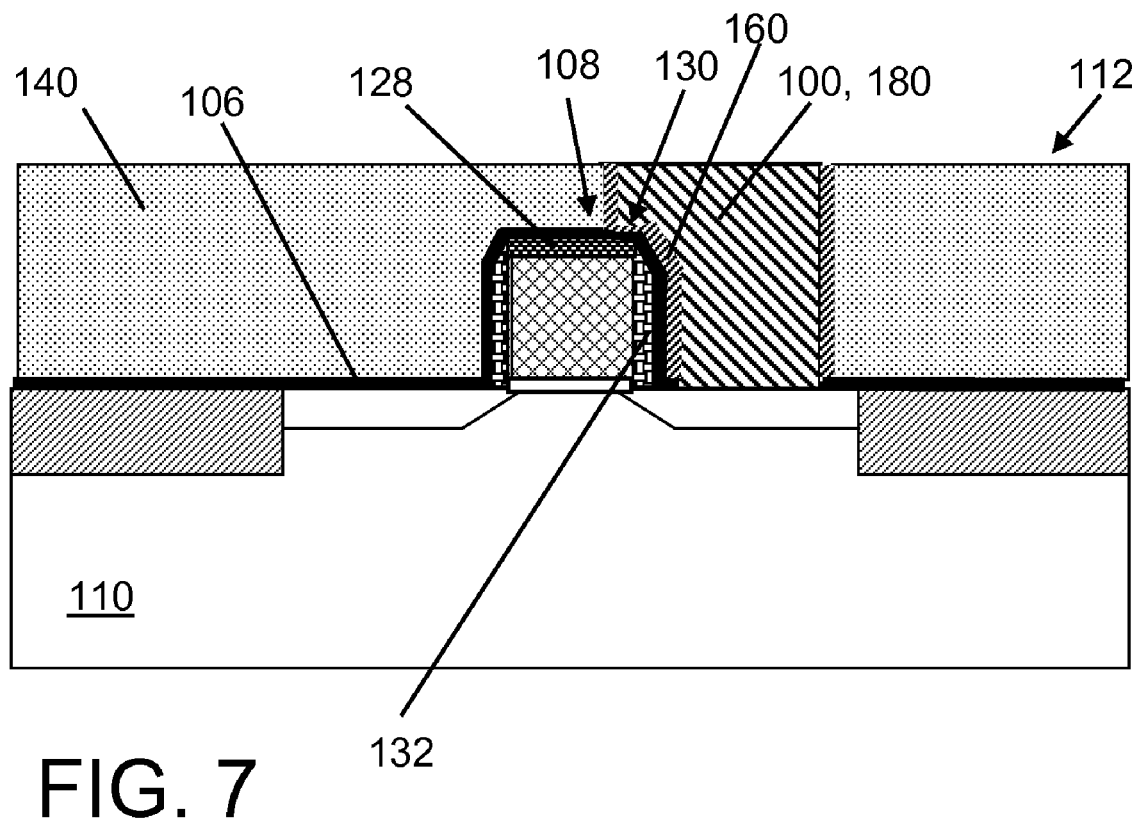

Turning to the drawings, FIGS. 2-8 show methods of forming a contact 100 (FIG. 7) adjacent to a structure 108 on a substrate 110, with FIG. 7 also showing a related semiconductor device 112.

Figure 1:
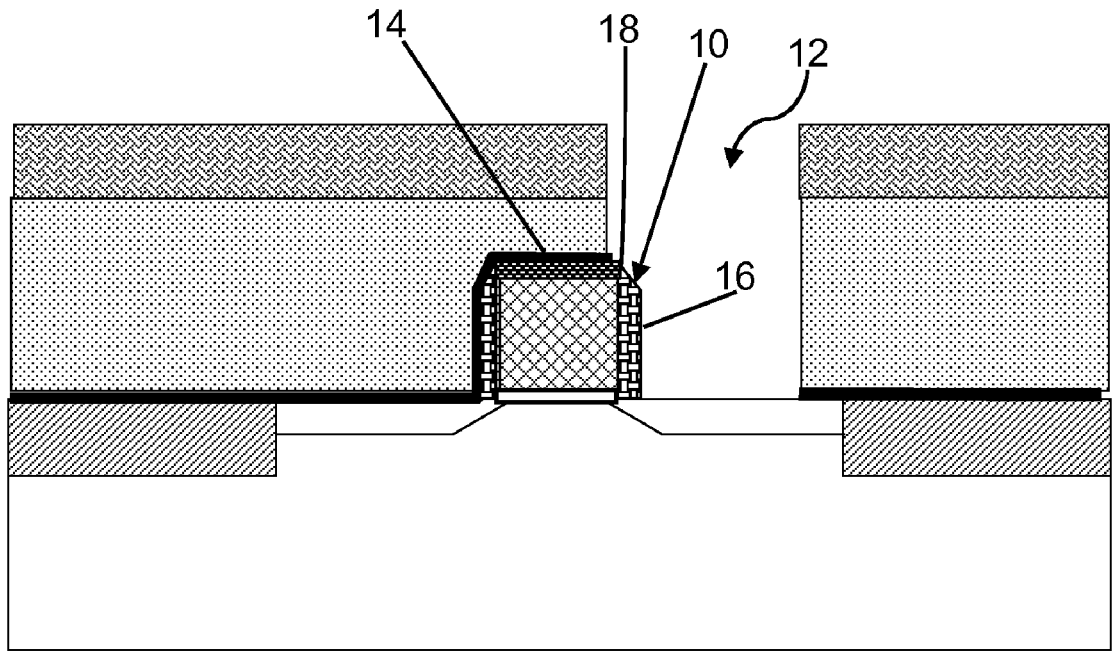
FIG. 1 shows a stage in a method of forming a contact according to the prior art.
Figure 2:
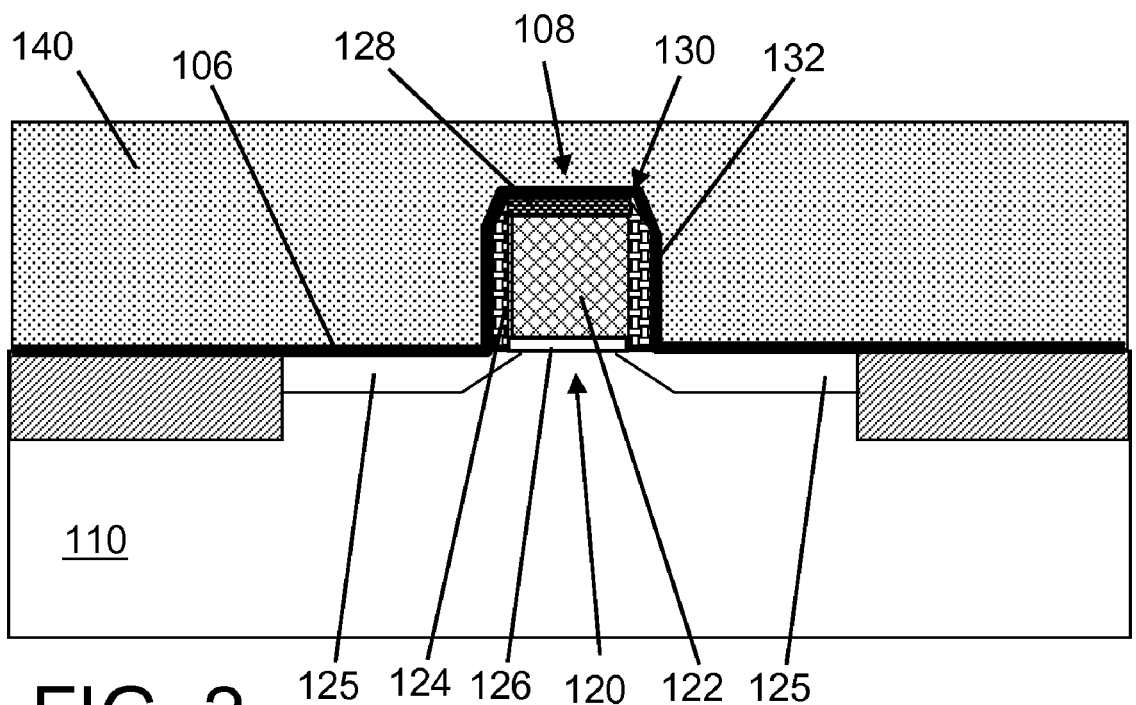
FIGS. 2-7 show cross-sectional views of methods of forming a contact adjacent to a structure according to embodiments of the disclosure, with FIG. 7 showing embodiments of a semiconductor device.

FIG. 2 shows forming a first liner 106 over a structure 108, e.g., a gate, and a substrate 110. Structure 108 is illustrated as a gate structure 120 including a gate conductor 122, spacers 124, source/drain 125, gate dielectric 126 and gate dielectric cap 128. Dielectric cap 128 may include aluminum oxide ($Al_2O_3$), silicon carbide (SiC), chemical vapor deposited (CVD) diamond or similar material to have high selectivity against silicon oxide ($SiO_2$) and silicon nitride ($Si_3N_4$). For example, aluminum oxide has at least about 10:1 ratio to silicon oxide. It is understood that although structure 108 will be described herein as a gate structure, it may include any variety of integrated circuit (IC) structure, e.g., capacitors, resistors, wires, etc.

As shown, first liner 106 covers a sidewall 132 and may cover a corner 130 of structure 108. First liner 106 may include silicon nitride, aluminum oxide or other common liner material. First liner 106 may be formed by deposition, which as used herein may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc. First liner 106 may have a thickness in the range of approximately 20 nm to approximately 2000 nm. In one embodiment, first liner 106 may include an intrinsic stress to improve carrier mobility of structure 108, i.e., a gate.

FIG. 2 also shows forming a dielectric layer 140, e.g., by depositing, over first liner 106 and structure 108. Dielectric layer 140 may include any now known or later developed interlayer dielectric such as CVD silicon oxide, tetraethyl orthosilicate ($Si(OC_2H_5)_4$ (TEOS)) based silicon oxide, doped glass such as fluorinated silicon oxide (FSG) or borophospho-silicate glass (BPSG), polymer, hydrogenated silicon oxycarbide (SiCOH), porous SiCOH, etc. Dielectric layer 140 may be planarized, if necessary.

Figure 3:
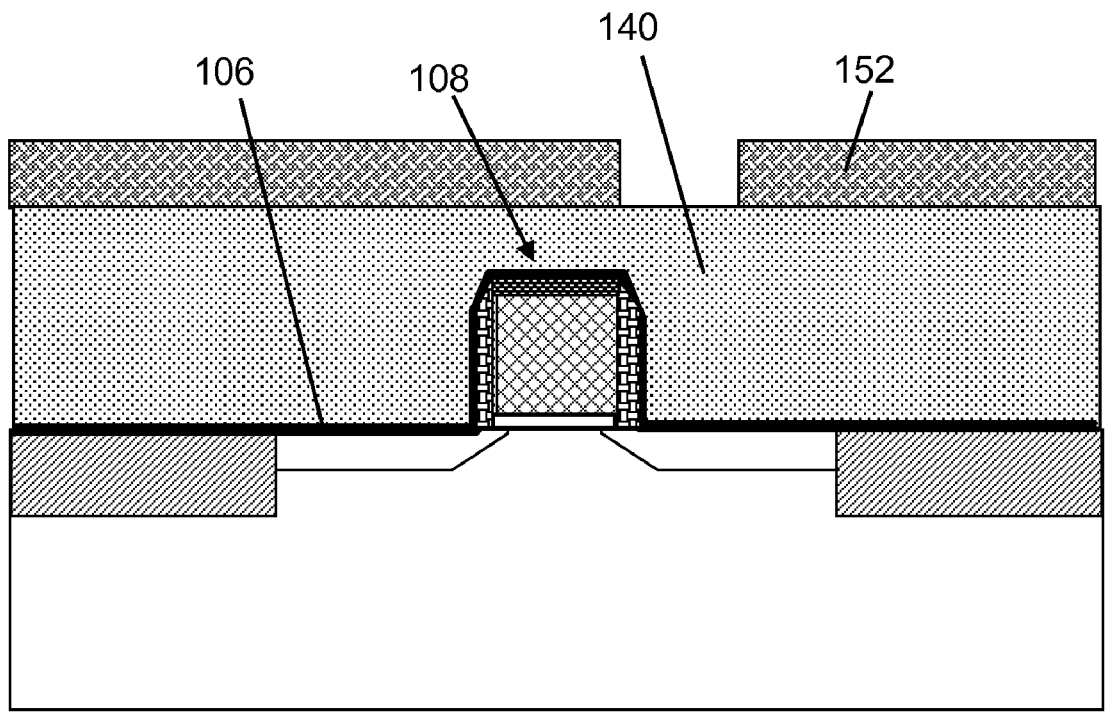
Figure 4:
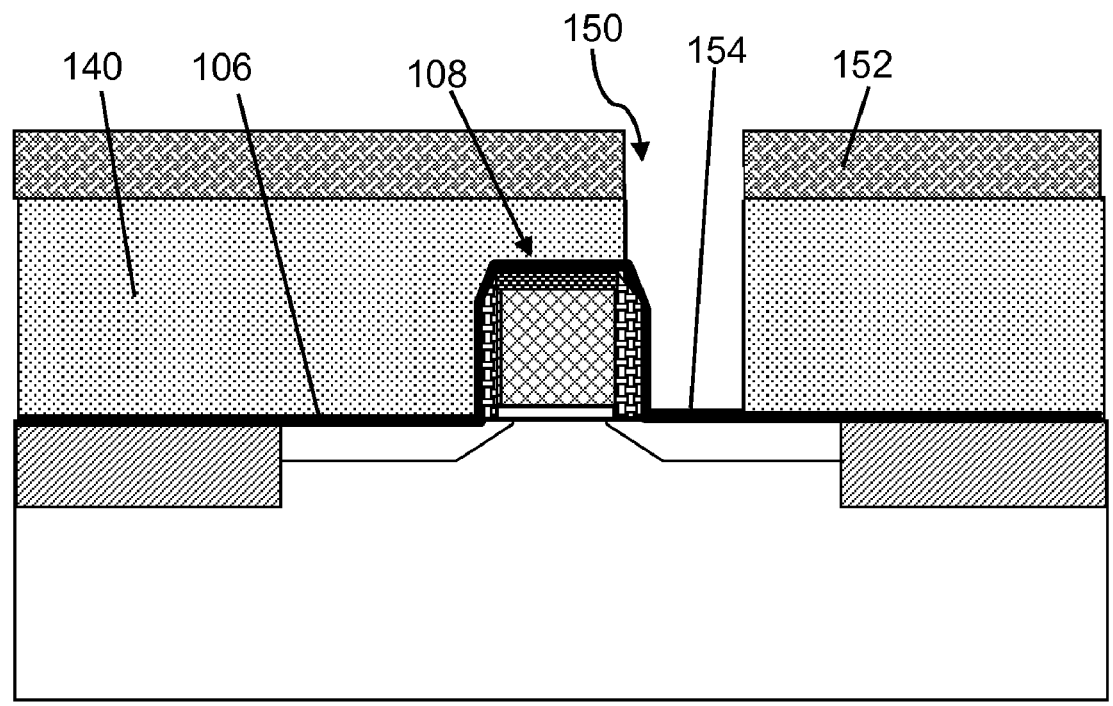

In FIGS. 3-4, forming a contact hole 150 (FIG. 4) in dielectric layer 140 to first liner 106 is shown. Contact hole 150 may be formed using any now known or later developed technique, e.g., depositing a mask 152, patterning mask 152, etching to open mask 152 and etching contact hole 150 using mask 152. As indicated, contact hole 150 does not penetrate first liner 106. In one embodiment, an etch rate ratio of first liner 106 to dielectric layer 140 is approximately 10:1 to approximately 100:1. In one particular example, dielectric layer 140 may be etched using a tetrafluoromethane ($CF_4$) and sulfur hexafluoride ($SF_6$) plasma, stopping at a top surface 154 of first liner 106. In this case, the etch selectivity may be about 10:1. In order to ensure contact resistance is not comprised by this method, a tolerance may be added to contact hole 150 diameter to ensure that the ultimate diameter of contact 100 (FIG. 7) meets ground rules. For example, as will be described below, if a second liner 160 (FIG. 5) has a thickness of 20 nm, then a tolerance may be 40 nm, i.e., approximately twice a thickness of second liner 160.

FIG. 5 shows forming (e.g., depositing) a second liner 160 in contact hole 150 (FIG. 4) including over first liner 106 on sidewall 132, and perhaps, corner 130. (Mask 152 has already been stripped). Second liner 160 may have a thickness in a range of approximately 5 nm to approximately 200 nm, and may include, for example, silicon nitride, aluminum oxide, tantalum nitride and/or titanium nitride. In one embodiment, first liner 106 and second liner 160 are made of different materials, e.g., aluminum oxide and silicon nitride, respectively. However, this is not necessary. After depositing second liner 160, contact hole 150 diameter becomes identical to that specified by the ground rules. Also, because of the geometric effect, second liner 160 is thicker at corner 130 of structure 108 than at a bottom 170 of contact hole 150, i.e., over substrate 110.

FIG. 6 shows removing first liner 106 and second liner 160 at bottom 170 of contact hole 150, e.g., using an isotropic etch. A certain degree of over-etching may be necessary to ensure liners 106,160 at bottom 170 are completely removed. Since liner 160 at corner 130 is thicker than at bottom 170, there is a reasonable process window to remove liner 106 and 160 from bottom 170 without damaging liner 160 at sidewall 132 of structure 108.

FIG. 7 shows filling contact hole 150 (FIG. 6) with a conductive material 180, e.g., tungsten (W), copper (Cu), aluminum (Al) or any other conventional contact material, to form contact 100. Conductive material 180 may be planarized, if necessary. A contact liner 182 (FIG. 8 only), e.g., of tantalum nitride, may also be employed.

Figure 8:
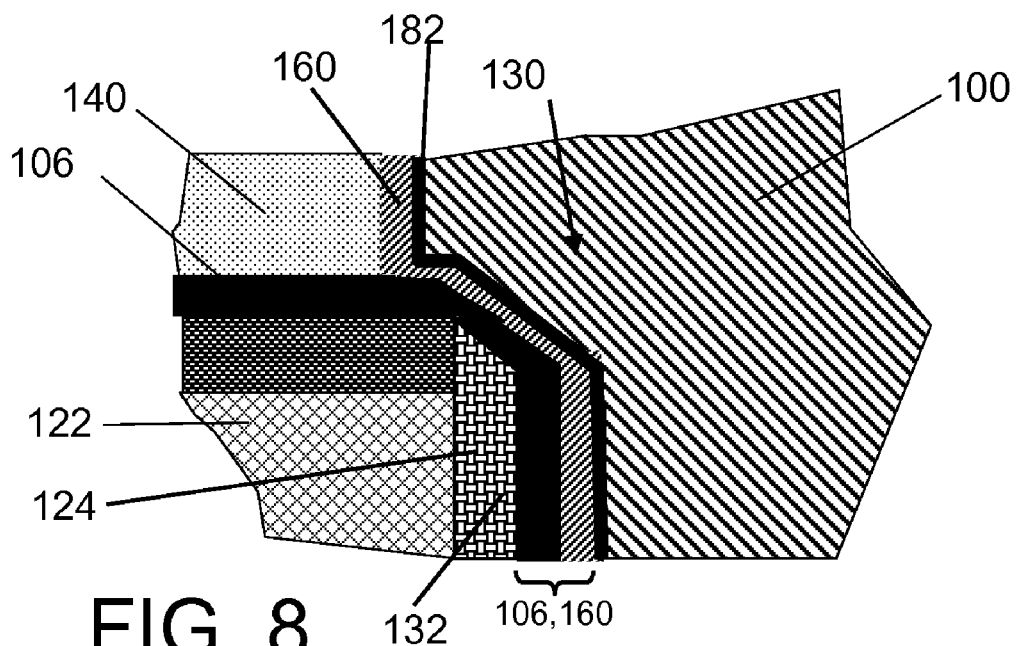
FIG. 8 shows an enlarged view in the vicinity of a corner of the structure of FIG. 7.

FIG. 8 shows an enlarged view in the vicinity of corner 130 of structure 108 of FIG. 7. Liners 106, 160 extending along sidewall 132 of structure 108, along with dielectric cap 128, prevent shorting. In one embodiment, one or more of liners 106, 160 may include an intrinsic stress to improve device performance. In this case, second liner 160 at least maintains the intrinsic stress of first liner 106 at bottom 170 (FIG. 6) of contact hole 150. In particular, where first liner 106 is pierced by contact 100, it causes loss of stress characteristics, e.g., loss of compressive-ness for a PFET device. However, second liner 160 maintains the positioning of first liner 106, thus preventing loss of stress therein. In addition, where second liner 160 includes an intrinsic stress, it may be additive to the intrinsic stress of first liner 106. For example, where first liner 106 is intrinsically tensilely stressed for an NFET, second liner 160 also being intrinsically tensilely stressed adds to the stress, and may further improve performance of the NFET. Second liner 160 may also be subtractive to the intrinsic stress of first liner 106, where, for example, tuning of the stress is desirable. Double liners 106, 160 also inherently reduce the Miller coupling capacitance, which is advantageous for high-performance.

It is understood that while embodiments of forming contact 100 have been described herein, other methods may also be employed. For example, another embodiment may include forming gate structure 108 on substrate 110 including dielectric cap 128, and forming liner 106, 160 over gate structure 108 and the substrate, the liner having a thickness along sidewall 132 of gate structure 108 that is greater than a thickness of the liner 106 over substrate 110. Contact 100 extending over corner 132 of gate structure 108 is prevented from shorting by liner 106, 160 and dielectric cap 128, i.e., the latter prevent opening of corner 130 during the contact forming.

Returning to FIG. 7, one embodiment of a semiconductor device 112 is also shown. Semiconductor device 112 includes gate structure 108 including dielectric cap 128, contact 100 adjacent to gate structure 108, the contact extending over corner 130 of gate structure 108; first liner 106 extending along sidewall 132 of gate structure 108; and second liner 160 over first liner 106 over sidewall 132 of gate structure 108. Gate structure 108 has a size in a 90 nm technology or beyond. As noted above, at least one of first liner 106 and second liner 160 may include an intrinsic stress. First liner 106 may have a thickness in the range of approximately 20 nm to approximately 2000 nm, and second liner 160 may have a thickness in a range of approximately 5 nm to approximately 20 nm.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A semiconductor device comprising:
a gate structure including a dielectric cap;
a contact adjacent to the gate structure, the contact extending over a corner of the gate structure and over at least a portion of a top surface of the gate structure;
a first liner extending over the gate structure, including over the corner of the gate structure, and over a substrate below the gate structure;
a second liner over a portion of the first liner, the second liner extending only over the corner of the gate structure and along the sidewall of the gate structure and along an entire sidewall of the contact, wherein a bottom of the contact directly contacts a source/drain region within the substrate; and
a contact liner extending over the second liner and along the entire sidewall of the contact, wherein the second liner and the contact liner include different materials.

2. The semiconductor device of claim 1, wherein the gate structure has a size in a 90 nm technology or beyond.

3. The semiconductor device of claim 1, wherein at least one of the first liner and the second liner includes an intrinsic stress.

4. The semiconductor device of claim 1, wherein the first liner has a thickness in the range of approximately 20 nm to approximately 2000 nm, and the second liner has a thickness in a range of approximately 5 nm to approximately 20 nm.

5. The semiconductor device of claim 1, wherein the first liner includes silicon nitride.

* * * * *